United States Patent
Liu et al.

(10) Patent No.: US 11,580,888 B2
(45) Date of Patent: Feb. 14, 2023

(54) STRETCHABLE DISPLAY PANEL, METHOD FOR COMPENSATING THRESHOLD VOLTAGE OF TRANSISTOR AND COMPUTER READABLE STORAGE MEDIUM

(71) Applicant: BOE Technology Group Co., Ltd., Beijing (CN)

(72) Inventors: Libin Liu, Beijing (CN); Qian Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/414,126

(22) PCT Filed: Oct. 19, 2020

(86) PCT No.: PCT/CN2020/121821
§ 371 (c)(1),
(2) Date: Jun. 15, 2021

(87) PCT Pub. No.: WO2021/078089
PCT Pub. Date: Apr. 29, 2021

(65) Prior Publication Data
US 2022/0068177 A1 Mar. 3, 2022

(30) Foreign Application Priority Data
Oct. 21, 2019 (CN) .......................... 201911003295.7

(51) Int. Cl.
*G09G 3/00* (2006.01)
*G09G 3/3233* (2016.01)
(Continued)

(52) U.S. Cl.
CPC ........... *G09G 3/035* (2020.08); *G09G 3/3233* (2013.01); *H01L 29/78645* (2013.01);
(Continued)

(58) Field of Classification Search
CPC .................. G09G 3/035; G09G 3/3233; H01L 29/78645; H01L 29/78648; H01L 29/78696
(Continued)

(56) References Cited

U.S. PATENT DOCUMENTS 10,249,238 B2   4/2019  Ko et al.
10,453,396 B2   10/2019 Koong
(Continued)

FOREIGN PATENT DOCUMENTS

CN   105679236 A   6/2016
CN   108010948 A   5/2018
(Continued)

OTHER PUBLICATIONS

English Translation of International Search Report dated Jan. 21, 2021, issued in counterpart Application No. PCT/CN2020/121821. (3 pages).

(Continued)

*Primary Examiner* — Prabodh M Dharia
(74) *Attorney, Agent, or Firm* — WHDA, LLP

(57) ABSTRACT

A stretchable display panel, a method for compensating a threshold voltage of a transistor in the stretchable display panel, and a computer readable storage medium. The stretchable display panel includes: a base substrate; a transistor on the base substrate, the transistor includes a gate electrode layer and an active layer that are at least partially stacked; and a voltage compensation layer, the voltage compensation layer is located between the transistor and the base substrate, wherein the voltage compensation layer is applied with a compensation voltage that depends on a stretching amount of the stretchable display panel.

17 Claims, 9 Drawing Sheets

(51) Int. Cl.
*H01L 29/786* (2006.01)
*H01L 27/32* (2006.01)
*H01L 51/00* (2006.01)

(52) U.S. Cl.
CPC .. *H01L 29/78648* (2013.01); *H01L 29/78696* (2013.01); *G09G 2300/0842* (2013.01); *G09G 2320/0233* (2013.01); *G09G 2360/145* (2013.01); *H01L 27/3272* (2013.01); *H01L 29/78603* (2013.01); *H01L 51/0097* (2013.01); *H01L 2251/5338* (2013.01)

(58) Field of Classification Search
USPC .................................. 345/212, 690; 361/807
See application file for complete search history.

(56) References Cited

U.S. PATENT DOCUMENTS

| | | | |
|---|---|---|---|
| 2012/0026146 A1 | 2/2012 | Kim | |
| 2014/0049933 A1* | 2/2014 | Gatzen | H05K 1/0271 361/807 |
| 2014/0306985 A1 | 10/2014 | Jeong et al. | |
| 2016/0077553 A1* | 3/2016 | Hyun | G09G 3/035 345/690 |
| 2016/0196782 A1 | 7/2016 | Lee et al. | |
| 2016/0321996 A1 | 11/2016 | Lee et al. | |
| 2017/0077199 A1 | 3/2017 | Nguyen et al. | |
| 2018/0033849 A1* | 2/2018 | Noh | H01L 27/1222 |
| 2018/0122302 A1 | 5/2018 | Koong | |
| 2018/0174523 A1 | 6/2018 | Jeon et al. | |
| 2019/0279573 A1 | 9/2019 | Zhou | |
| 2019/0305062 A1 | 10/2019 | Wang et al. | |
| 2019/0332841 A1* | 10/2019 | Zhou | G06V 40/1306 |
| 2019/0378456 A1* | 12/2019 | Choi | G09G 3/3225 |
| 2020/0133343 A1* | 4/2020 | Lee | H01L 27/3276 |
| 2020/0211437 A1* | 7/2020 | Ahn | H01L 27/3276 |
| 2021/0049944 A1 | 2/2021 | Xu | |
| 2021/0118918 A1 | 4/2021 | Liu | |
| 2021/0158732 A1* | 5/2021 | Zhang | G09G 3/3233 |
| 2021/0225280 A1 | 7/2021 | Li et al. | |
| 2021/0264837 A1* | 8/2021 | Ahn | G09G 3/3225 |

FOREIGN PATENT DOCUMENTS

| | | |
|---|---|---|
| CN | 108022553 A | 5/2018 |
| CN | 207503616 U | 6/2018 |
| CN | 108364602 A | 8/2018 |
| CN | 108630663 A | 10/2018 |
| CN | 109473057 A | 3/2019 |
| CN | 109728064 A | 5/2019 |
| CN | 110164340 A | 8/2019 |
| CN | 110164364 A | 8/2019 |
| CN | 110323254 A | 10/2019 |
| CN | 110706655 A | 1/2020 |

OTHER PUBLICATIONS

Office Action dated Jul. 22, 2020, issued in counterpart CN Application No. 201911003295 7, with English Translation. (24 pages).

* cited by examiner

STRETCHABLE DISPLAY PANEL, METHOD FOR COMPENSATING THRESHOLD VOLTAGE OF TRANSISTOR AND COMPUTER READABLE STORAGE MEDIUM

CROSS-REFERENCE TO RELATED APPLICATION

This application is a Section 371 National Stage Application of International Application No. PCT/CN2020/121821 filed on Oct. 19, 2020, entitled "STRETCHABLE DISPLAY PANEL, THRESHOLD VOLTAGE. COMPENSATION METHOD FOR TRANSISTOR, AND COMPUTER READABLE STORAGE MEDIUM", which claims priority to Chinese Application No. 201911003295.7, filed on Oct. 21, 2019, the content of which is incorporated herein by reference in their entirety.

TECHNICAL FIELD

The present disclosure relates to a field of display technology, and in particular to a stretchable display panel, a method for compensating a threshold voltage of a transistor in the stretchable display panel, and a computer readable storage medium.

BACKGROUND

In OLED (Organic Light Emitting Diode) display panels, more and more flexible designs are expected to meet various requirements. For example, it is hoped that display panels may be stretched to a certain extent. In order to meet such a requirement, a stretchable display panel may need some anti-fracture design in its mechanical structure. However, researches and special designs of electrical properties of the stretchable display panel in a stretched state are still insufficient.

SUMMARY

In order to at least partially overcome defects and/or deficiencies in above-mentioned related art, the embodiments of the present disclosure provide a stretchable display panel, a method for compensating a threshold voltage of a transistor in the stretchable display panel, and a computer readable storage medium.

Technical solutions provided by the embodiments of the present disclosure are as follows.

According to an aspect of the embodiments of the present disclosure, a stretchable display panel is provided, including:

a base substrate;

a transistor on the base substrate, wherein the transistor includes a gate electrode layer and an active layer that are at least partially stacked; and a voltage compensation layer, wherein the voltage compensation layer is located between the transistor and the base substrate, wherein the voltage compensation layer is applied with a compensation voltage that depends on a stretching amount of the stretchable display panel.

In some embodiments, the stretchable display panel further includes a controller, wherein an output terminal of the controller is electrically connected to the voltage compensation layer, and the controller is configured to apply the compensation voltage to the voltage compensation layer according to the stretching amount of the stretchable display panel.

In some embodiments, the stretchable display panel further includes a memory, wherein a compensation voltage reference table is stored in the memory, and the controller is configured to generate the compensation voltage by looking up a required compensation voltage value in the compensation voltage reference table based on the stretching amount of the stretchable display panel.

In some embodiments, the voltage compensation layer includes a light shielding layer, and the light shielding layer at least partially shields the active layer.

In some embodiments, an orthographic projection of the voltage compensation layer on the base substrate covers an orthographic projection of the active layer in the transistor on the base substrate.

In some embodiments, wherein an edge of the orthographic projection of the voltage compensation layer on the base substrate at least partially exceeds an edge of the orthographic projection of the active layer in the transistor on the base substrate by at least 0.8 micrometers.

In some embodiments, the edge of the orthographic projection of the voltage compensation layer on the base substrate at least partially exceeds the edge of the orthographic projection of the active layer in the transistor on the base substrate by at least 3 micrometers.

In some embodiments, an orthographic projection of the gate electrode layer in the transistor on the base substrate covers an orthographic projection of the voltage compensation layer on the base substrate.

In some embodiments, an edge of the orthographic projection of the gate electrode layer on the base substrate in the transistor at least partially exceeds an edge of the orthographic projection of the voltage compensation layer on the base substrate by at least 1 micrometer.

In some embodiments, one of the gate electrode layer and the active layer is located between the voltage compensation layer and the other one of the gate electrode layer and the active layer.

In some embodiments, the stretchable display panel further includes an organic light-emitting diode light-emitting element, wherein the transistor is a driving thin film transistor that configured to drive the light-emitting element to emit light.

In some embodiments, a thickness of the voltage compensation layer is between 60 and 150 nanometers.

In another aspect of the embodiments of the present disclosure, a method for compensating a threshold voltage of a transistor in a stretchable display panel is provided, wherein the transistor is located on a base substrate of the stretchable display panel, a voltage compensation layer is disposed between the base substrate and the transistor, and the compensating method includes:

detecting a stretching amount of the stretchable display panel;

generating a compensation voltage according to the stretching amount of the stretchable display panel; and applying the compensation voltage to the voltage compensation layer of the stretchable display panel to reduce or eliminate a shift of the threshold voltage of the transistor caused by the stretching amount of the stretchable display panel.

In some embodiments, the method for compensating a threshold voltage of a transistor in a stretchable display panel further includes: generating a compensation voltage reference table, wherein the generating a compensation voltage according to the stretching amount of the stretchable display panel includes:

generating the compensation voltage by looking up a required compensation voltage value in the compensation voltage reference table based on the stretching amount of the stretchable display panel.

In some embodiments, the generating a compensation voltage reference table includes:

measuring threshold voltage values of the transistor under different stretching amounts of the stretchable display panel;

measuring or calculating required compensation voltage values of the transistor to maintain a constant threshold voltage value under different stretching amounts of the stretchable display panel; and generating the compensation voltage reference table according to the required compensation voltage values under different stretching amounts of the stretchable display panel.

In some embodiments, the generating the compensation voltage reference table further includes:

adding a relationship between the stretching amount and the compensation voltage that is not contained in the compensation voltage reference table into the compensation voltage reference table.

In some embodiments, the transistor is a thin film driving transistor for driving a light-emitting element in the stretchable display panel to emit light, and the generating a compensation voltage reference table includes:

measuring light-emitting brightness of the stretchable display panel under different stretching amounts;

measuring or calculating required compensation voltage values to maintain constant light-emitting brightness of the stretchable display panel under different stretching amounts; and generating the compensation voltage reference table according to the required compensation voltage values to maintain the constant light-emitting brightness of the stretchable display panel under different stretching amounts.

According to yet another aspect of the embodiments of the present disclosure, a computer-readable storage medium is provided, wherein the computer-readable storage medium stores computer instructions configured to perform a method for compensating a threshold voltage of a transistor in a stretchable display panel, the transistor is located on a base substrate of the stretchable display panel, a voltage compensation layer is disposed between the base substrate and the transistor, and following steps are implemented when the instruction is executed by a processor:

obtaining a stretching amount of the stretchable display panel;

generating a compensation voltage according to the stretching amount of the stretchable display panel; and applying the compensation voltage to the voltage compensation layer of the stretchable display panel to reduce or eliminate a shift of the threshold voltage of the transistor caused by the stretching amount of the stretchable display panel.

BRIEF DESCRIPTION OF THE DRAWINGS

In order to clearly describe technical solutions in the embodiments of the present disclosure or related technologies, drawings to be used in the description of the embodiments will be briefly introduced below. Obviously, the drawings in following description are only some embodiments of the present disclosure. For those skilled in the art, other drawings may also be obtained based on the drawings without creative work, wherein.

DETAILED DESCRIPTION OF EMBODIMENTS

Figure 1:
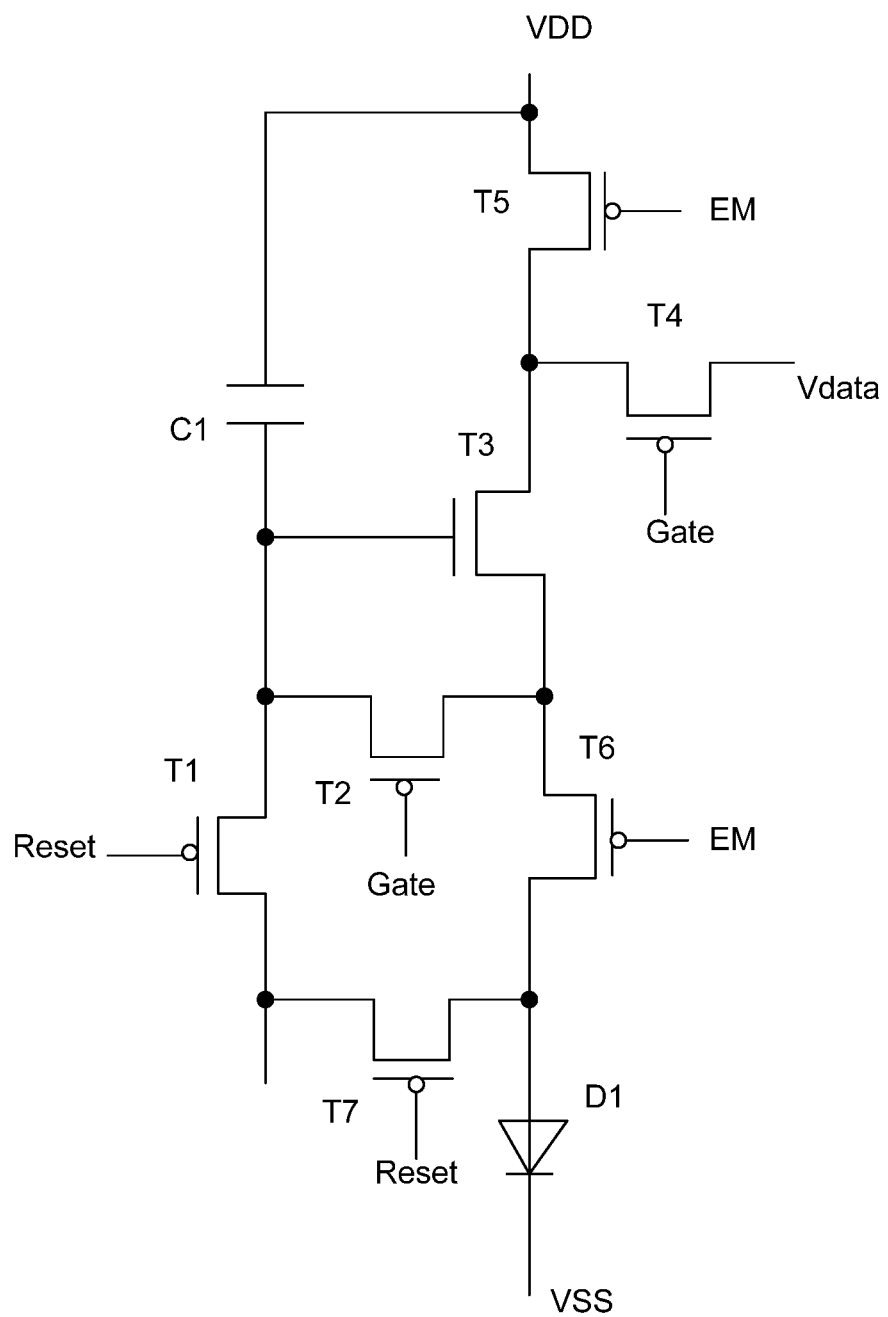
FIG. 1 illustrates a schematic diagram of an exemplary pixel driving circuit of an OLED display panel.

In order to make objectives, technical solutions and advantages of the embodiments of the present disclosure more apparent, technical solutions in the embodiments of the present disclosure will be described clearly and completely in conjunction with the accompanying drawings in the embodiments of the present disclosure. Obviously, the embodiments described are a part of the embodiments of the present disclosure, not all of the embodiments of the present disclosure. Based on the described embodiments of the present disclosure, all other embodiments obtained by those skilled in the art without creative work are all within the protection scope of the present disclosure. It should be noted that throughout the drawings, the same elements are indicated by the same or like reference numerals. In the following description, some specific embodiments are examples of the embodiments of the present disclosure and are only used for descriptive purposes, and should not be understood as limiting the present disclosure. When it may cause confusion in understandings of the present disclosure, conventional structures or configurations will be omitted. It should be noted that the shape and the size of each component in the drawings do not reflect actual sizes and ratios, which merely illustrate the content of the embodiments of the present disclosure.

Unless otherwise defined, technical or scientific terms used in the embodiments of the present disclosure should have general meanings understood by those skilled in the art. "First", "second" and similar words used in the embodiments of the present disclosure do not indicate any order, quantity, or importance, and are only used to distinguish different components.

In addition, in the description of the embodiments of the present disclosure, the term "electrically connected" may indicate that two components are directly electrically connected or may indicate that two components are electrically connected via one or more other components. In addition, the two components may be electrically connected or coupled in a wired manner or a wireless manner.

Transistors used in the embodiments of the present disclosure may all be thin film transistors or field effect transistors or other devices with the same characteristics. Since a source electrode and a drain electrode of the thin film transistor are symmetrical, the source electrode and the drain electrode may be interchanged. In following examples, a p-type thin film transistor functioned as a driving transistor is mainly described, and other transistors have the same or different types with the driving transistor according to a circuit design. Similarly, in other embodiments, the driving transistor may also be shown as an n-type thin film transistor.

FIG. 1 illustrates a schematic diagram of an exemplary pixel driving circuit of an OLED display panel. The pixel driving circuit includes a first transistor T1, a second transistor T2, a third transistor T3, a fourth transistor T4, a fifth transistor T5, a sixth transistor T6, a seventh transistor T7, a storage capacitor C1 and other elements. Gate electrodes of the first transistor T1, the second transistor T2, the fourth transistor T4, the fifth transistor T5, the sixth transistor T6 and the seventh transistor T7 are respectively controlled by specific signals such as EM, Reset, and Gate, etc. (specifically, for example, as shown in FIG. 1, the respective gate electrodes of the first transistor T1 and the seventh transistor T7 are controlled by the Reset signal, the respective gate electrodes of the second transistor T2 and the fourth transistor T4 are controlled by the Gate signal, and the respective gate electrodes of the fifth transistor T5 and the sixth transistor T6 are controlled by the signal EM). The third transistor T3 is a driving transistor, which is configured to mainly control a data voltage Vdata on a signal line for driving a light-emitting element D1 to emit light. Both VDD and VSS signals are DC voltage signals, which are configured to provide a necessary voltage for driving the light-emitting element D1 to emit light (specifically, for example, the VDD serves as a power supply voltage of a circuit, and the VSS serves as an operating voltage of the light-emitting element D1).

When a stretchable display panel is stretched, a threshold voltage of a driving transistor (for example, the T3) of the stretchable display panel which is configured to drive pixels to emit light will change accordingly. Refer to Table 1 below which illustrates a comparison of parameter changes of the driving transistor at different tested positions on the stretchable display panel under two states of "display panel unstretched" and "display panel stretched about 10%", when the display panel is stretched by about 10%, compared with the state where the display panel is unstretched, the threshold voltage (expressed in Vth, that is, a gate electrode voltage when the driving transistor is in a critical conductive state) of the driving transistor (abbreviated as DTFT) may generally be negatively Shifted by about 1 volt. Correspondingly, on one hand, a carrier mobility (Mob) will decrease; and at the same time, on the other hand, Sub-threshold swing (abbreviated as SS), which is a performance indicator that characterizes a conversion rate between turn-on and turn-off states of the transistor will increase, since the SS is numerically equal to the gate electrode voltage increment ΔVgs that required to change a drain electrode current Id by an order of magnitude. Obviously, the smaller the SS, the faster the ON/OFF switching of turn-on/turn-off rate, and the increase of the SS results in a slower conversion rate between the turn-on and turn-off states of the transistor. Therefore, the decrease in the threshold voltage of the driving transistor is unbeneficial to a driving ability of a circuit. However, if the driving ability of the driving transistor is simply increased by increasing a driving voltage of an entire panel, it may affect operations of other devices and increase the power consumption.

TABLE 1

Parameter changes of the drive transistor at different tested positions on the stretchable display panel

| | display panel unstretched | | | display panel stretched about 10% | | |
|---|---|---|---|---|---|---|
| Number | Vth (V) | Mob | SS | Vth (V) | Mob | SS |
| A2 | −2.60 | 100.3 | 0.27 | −3.48 | 91.4 | 0.43 |
| A3 | −2.84 | 101.0 | 0.26 | −3.48 | 94.4 | 0.43 |
| A4 | −2.37 | 101.4 | 0.28 | −3.30 | 92.9 | 0.43 |
| A5 | −2.47 | 104.5 | 0.27 | −3.40 | 94.6 | 0.41 |
| A6 | −2.40 | 102.5 | 0.25 | −3.37 | 91.4 | 0.42 |
| A7 | −2.48 | 102.9 | 0.27 | −3.16 | 94.1 | 0.41 |
| A8 | −2.33 | 99.2 | 0.26 | −3.33 | 91.3 | 0.42 |
| A9 | −2.40 | 101.8 | 0.26 | −3.30 | 93.5 | 0.39 |
| AX | −2.40 | 101.0 | 0.27 | −3.37 | 93.2 | 0.41 |
| B1 | −2.17 | 101.7 | 0.26 | −3.17 | 93.2 | 0.43 |
| B2 | −2.20 | 97.2 | 0.26 | −3.23 | 92.5 | 0.42 |
| B4 | −2.10 | 100.9 | 0.28 | −3.12 | 94.4 | 0.42 |
| B5 | −2.27 | 104.2 | 0.26 | −3.17 | 95.4 | 0.42 |

Figure 2:
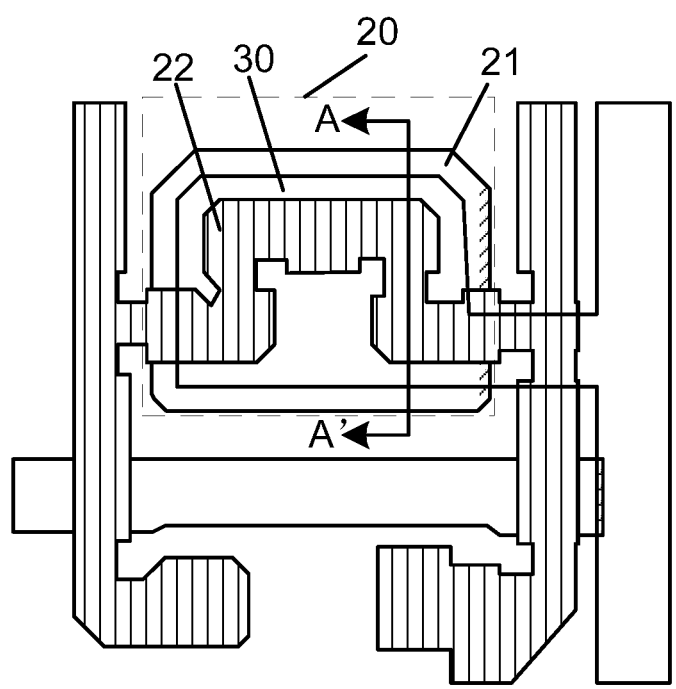
FIG. 2 schematically illustrates a partial film layer structure in a display panel corresponding to a driving transistor T3 in the pixel driving circuit of FIG. 1 according to some embodiments of the present disclosure.
Figure 3:
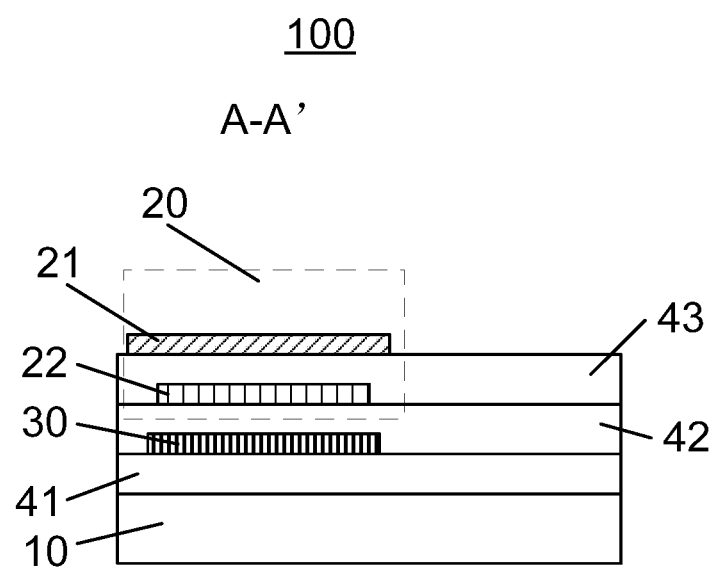
FIG. 3 schematically illustrates an exemplary cross-sectional view of the display panel taken along line AA' in FIG. 2 according to some embodiments of the present disclosure.

In order to solve above problems, according to a general technical concept of the embodiments of the present disclosure, in one aspect of the embodiments of the present disclosure, a structure of a stretchable display panel is provided. FIGS. 2 and 3 illustrate an exemplary structure of such a stretchable display panel 100. For clarity, a plan view of FIG. 2 only illustrates a transistor 20 and a partial structure of the surroundings thereof, and FIG. 2 only illustrates a gate electrode layer 21, an active layer 22, and a voltage compensation layer 30. FIG. 3 is a cross-sectional view taken along line AA' in FIG. 2. As shown in FIGS. 2 and 3, the stretchable display panel 100 includes: a base substrate 10; the transistor 20 on the base substrate 10, and the voltage compensation layer 30. The transistor 20 includes the gate electrode layer 21 and the active layer that are at least partially stacked (that is, an orthographic projection of the gate electrode layer 21 on the base substrate 10 at least partially overlaps with an orthographic projection of the active layer 22 on the base substrate 10). The voltage compensation layer 30 is located between the transistor 20 and the base substrate 10. And, as shown in FIG. 3, in addition to the gate electrode layer 21, the active layer 22, and the voltage compensation layer 30 shown in FIG. 2, it is also shown that the stretchable display panel 100 additionally includes a plurality of insulating layers, such as a first insulating layer 41 (for example, a barrier layer made of polyimide, etc.) between the base substrate 10 and the voltage compensation layer 30, a second insulating layer 42 (for example, a buffer layer made of silicon oxide, etc.) between the active layer 22 and the voltage compensation layer 30, and a third insulating layer 43 (for example, a buffer layer made of silicon oxide or, etc.) between the gate electrode layer 21 and the active layer 22, and so on. The plurality of insulating layers such as the first insulating layer 41 are optional.

In the embodiments of the present disclosure, the voltage compensation layer 30 is applied with a compensation voltage that depends on a stretching amount of the stretchable display panel 100 during operation. Applying the compensation voltage to the voltage compensation layer 30 may effectively suppress the negative shift of the threshold voltage of the transistor 20 caused by a stretching of the display panel. For example, when the transistor 20 is a p-type transistor, an appropriate negative voltage may be applied to the voltage compensation layer 30 to at least partially eliminate or completely offset the negative shift of the threshold voltage caused by the stretching of the display panel. Table 2 below illustrates an example of applying the compensation voltage to the voltage compensation layer 30. It can be seen from Table 2 that when a stretching amount (the stretching amount is represented by, for example, a length change value of the display panel in a certain direction, or alternatively, the stretching amount is represented by a ratio of the length change value of display panel to an original length) of the display panel gradually increases, the negative shift of the threshold voltage of the transistor (or a change amount in the threshold voltage) ΔVth gradually increases accordingly; after the compensation voltage is applied to the voltage compensation layer 30, the negative shift of the threshold voltage is, for example, at least partially eliminated until completely offset. In practice, the compensation voltage needs to vary with the stretching amount of the display panel.

TABLE 2

Compensation voltage corresponding to different stretching amounts of the display panel

| stretching amount | Vth | ΔVth | Compensation voltage | Vth after adjustment |
|---|---|---|---|---|
| 0% | −2.9 V | 0 V | 0 V | −2.9 V |
| 2% | −3 V | −0.1 V | −0.5 V | −2.9 V |
| 4% | −3.4 V | −0.5 V | −2 V | −2.9 V |
| 6% | −3.5 V | −0.6 V | −2.5 V | −2.9 V |

In the embodiments of the present disclosure, the voltage compensation layer 30 is conductive in a working state, for example, the voltage compensation layer 30 is made of a conductive material.

Figure 6:
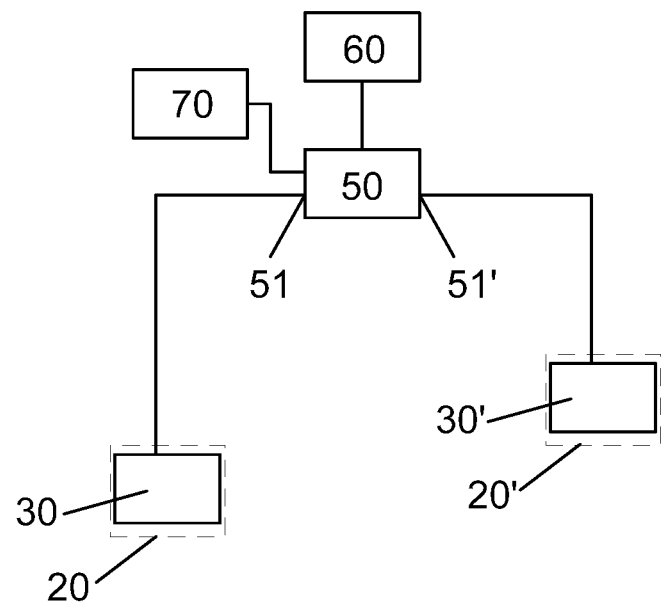
FIG. 6 schematically illustrates a controller on a display panel and a connection between the controller and a voltage compensation layer according to some embodiments of the present disclosure.

In the embodiments of the present disclosure, as shown in FIG. 6, the stretchable display panel 100 further includes, for example, a controller 50. An output terminal 51 of the controller 50 is, for example, electrically connected to the voltage compensation layer 30, so as to apply the compensation voltage to the voltage compensation layer 30 according to the stretching amount of the display panel 100. It should be noted that, for example, a plurality of transistors are disposed on the display panel 100. Therefore, when the plurality of transistors (such as two transistors 20 and 20' shown in the drawing) need to be respectively compensated, the controller 50 includes, for example, a plurality of output terminals (for example, two output terminals 51, 51' shown in the drawing). The plurality of output terminals are respectively electrically connected to a plurality of voltage compensation layers corresponding to different transistors (for example, voltage compensation layers 30 and 30' shown in the drawing and corresponding to the two transistors 20 and 20', respectively), so as to apply compensation voltages to different voltage compensation layers 30 and 30', respectively. According to requirements, for different transistors (for example, the two transistors 20, 20' shown in the drawing), compensation voltages applied to the corresponding voltage compensation layers 30 and 30' are, for example, the same or different.

In some embodiments, the controller 50 is, for example, implemented by various processors.

In the embodiments of the present disclosure, on one hand, by providing the voltage compensation layer 30, the compensation voltage applied to the voltage compensation layer is configured to suppress (at least partially eliminate or completely offset) the negative shift of the threshold voltage of the transistor caused by the stretching of the display panel.

Moreover, in the embodiments of the present disclosure, on the other hand, once a drain current in a transistor is higher than a certain value, an output characteristic curve (that is, a source/drain current curve with a change of a source/drain voltage when the gate voltage is fixed, and a threshold voltage Vth as the gate voltage when the transistor is in a critical conductive state is also fixed) of the transistor has a Kink effect. Substantially, the Kink effect is a floating body effect due to a well body region of the transistor is in a suspended state so that charges generated by a collision of ionizations and high-energy carriers may not be quickly removed. That is, the Kink effect is an effect that causes the output characteristic curve to be distorted which is, for example, configured to characterize non-saturation characteristics of the drain current and drain voltage of the transistor herein. Considering a specific cause and a suppression method of the Kink effect, the cause may be interpreted as follows: when the drain voltage is sufficiently high, channel electrons may obtain sufficient energy from a high electric field region close to a drain electrode depletion region, an electron-hole pair is generated through collision with ionizations, the generated electron quickly passes through a channel region to reach the drain electrode, and the hole transfers to a lowest potential (that is, a body floating region). As the holes generated in the body floating region accumulate and form a forward bias to a source-body junction, a potential of the body floating region rises so that a barrier height of the body floating region decreases. As the drain voltage increases, the drain current will no longer be saturated, but increases rapidly, resulting in the Kink effect. A suppressing method of the Kink effect is, for example, typically through a body contact to suppress the Kink effect, that is, the well body region is connected to a fixed potential to control a change of a body potential, thereby achieving a purpose of controlling the barrier height of the well body region and finally stabilizing the source-drain circuit. Therefore, providing the voltage compensation layer 30 substantially suppresses the Kink effect of the transistor by providing a body contact so that an output current of the transistor is more stable. In short, a capacitor structure is formed relative to an insulating base substrate based on the transistor. Since the floating body effect caused by charges accumulating on the capacitor and may not be quickly removed results in the Kink effect in a saturated region of the transistor output characteristic curve, the voltage compensation layer may be additionally disposed between the transistor and the insulating base substrate to suppress the Kink effect.

In some embodiments, only a key transistor in the display panel (for example, the driving transistor for driving a light-emitting element) needs voltage compensation. The voltage compensation of the driving transistor is very beneficial for ensuring display brightness and uniformity of the display panel. However, the embodiments of the present disclosure are not limited to this, for example, transistors on the display panel other than the driving transistor may be compensated optionally.

In some embodiments, the stretchable display panel 100 further includes, for example, a memory 60, and a compensation voltage reference table is stored in the memory 60. The controller 50 is configured to generate a compensation voltage based on the stretching amount of the stretchable display panel and the compensation voltage reference table (specifically, based on an actual stretching amount, looking up an one-to-one correspondence between the stretching amount/a closed stretching amount VS the compensation voltage in the compensation voltage reference table, and thereby obtaining a required compensation voltage corresponding to the actual stretching amount). The compensation voltage reference table is, for example, realized by testing or simulation calculation. For example, based on results of Table 2 above, an example of compensation voltage reference table is obtained, which is shown in Table 3 below.

TABLE 3

An example of the compensation voltage reference table

| stretching amount | compensation voltage |
| --- | --- |
| 0% | 0 V |
| 2% | −0.5 V |
| 4% | −2 V |
| 6% | −2.5 V |

It could be seen from the simple example shown in Table 3 that the compensation voltage reference table contains a corresponding relationship between the stretching amount of the display panel and the compensation voltage. However, a specific form of the compensation voltage reference table is not limited to this, for example, it may be a mathematical look-up table, a map, etc., as long as it may indicate the corresponding relationship between the stretching amount of the display panel and the compensation voltage. In some embodiments, for example, a detector 70 (such as a strain sensor) is configured to detect the stretching amount of the display panel. The stretching amount of the display panel may also be determined by, for example, capturing changes in signal parameters (for example, threshold voltage, etc.) associated with the stretching amount of the display panel. In some embodiments, all or part of the controller 50, the memory 60, and the detector 70 are integrated in an integrated circuit chip.

In some embodiments, the voltage compensation layer 30 includes, for example, a light-shielding layer, and more specifically, for example, the voltage compensation layer 30 is in a specific form of the light-shielding layer, and the light-shielding layer at least partially shields the active layer 22. In this way, the voltage compensation layer 30 further prevents the active layer 22 from being excessively irradiated by radiation (for example, infrared light). Configured the voltage compensation layer 30 as the light-shielding layer may combine electrical functions such as voltage compensation and optical functions such as light-shielding in one same layer, thereby simplifying processes and avoiding excessive film layers. The voltage compensation layer 30 may be, for example, made of molybdenum and other metals.

In some embodiments, as shown in FIGS. 2 and 3, an orthographic projection of the voltage compensation layer 30 on the base substrate 10 covers an orthographic projection of the active layer 22 in the transistor 20 on the base substrate 10. For example, an edge of the orthographic projection of the voltage compensation layer 30 on the base substrate 10 at least partially exceeds an edge of the orthographic projection of the active layer 22 in the transistor 20 on the base substrate 10 by at least 0.8 micrometers, and for example, the edge of the orthographic projection of the voltage compensation layer on the base substrate at least partially exceeds the edge of the orthographic projection of the active layer in the transistor on the base substrate by at least 3 micrometers. The specific covering range of the voltage compensation layer 30 is configured as such in consideration of the fact that, when the voltage compensation layer 30 is applied with a voltage, an electric field at the edge of the voltage compensation layer 30 may not be as uniform as an electric field at an inner portion of the voltage compensation layer 30 far from the edge (caused by the edge of the voltage compensation layer 30 being at or adjacent to a boundary of different mediums). Therefore, if the voltage compensation layer 30 may not completely cover the active layer 22, an edge of a material such as polysilicon in the active layer 22 will be more obviously affected by the electric field at the edge of the voltage compensation layer 30, thereby resulting in abnormal crystallization.

It should be noted that in the above embodiments of the present disclosure, an entire edge of the orthographic projection of the voltage compensation layer 30 on the base substrate 10 may completely exceed the edge of the orthographic projection of the active layer 22 in the transistor 20 on the base substrate 10 by at least 0.8 micrometers or 3 micrometers, or a part of the edge of the orthographic projection of the voltage compensation layer 30 on the base substrate 10 may exceed the edge of the orthographic projection of the active layer 22 in the transistor 20 on the base substrate 10 by at least 0.8 micrometers or 3 micrometers.

In this way, the orthographic projection of the voltage compensation layer 30 on the base substrate 10 completely covers the orthographic projection of the active layer 22 in the transistor 20 on the base substrate 10, and the edge of the orthographic projection of the voltage compensation layer 30 on the base substrate 10 exceeds the edge of the orthographic projection of the active layer 22 in the transistor 20 on the base substrate 10 by a certain distance, so that an effect of weakening or suppressing an influence of the electric field at the edge of the voltage compensation layer 30 on a crystallization of the material in the active layer 22 is achieved.

In addition, when the voltage compensation layer 30 is configured as the light shielding layer, the orthographic projection of the voltage compensation layer 30 on the base substrate 10 completely covering the orthographic projection of the active layer 22 in the transistor 20 on the base substrate 10 is more beneficial for the voltage compensation layer 30 to shield the active layer 22.

In some embodiments, a shape of the gate electrode layer 21 in the transistor 20 is, for example, configured to be similar to the corresponding voltage compensation layer 30, as shown in FIG. 2.

In some embodiments, an orthographic projection of the gate electrode layer 21 in transistor 20 on the base substrate 10 covers the orthographic projection of the voltage compensation layer 30 on the base substrate 10. For example, an edge of the orthographic projection of the gate electrode layer 21 on the base substrate 10 in the transistor 20 exceeds the edge of the orthographic projection of the voltage compensation layer 30 on the base substrate 10 by at least 1 micrometer. The orthographic projection of the gate electrode layer 21 in the transistor 20 on the base substrate 10 completely covers the orthographic projection of the voltage compensation layer 30 on the base substrate 10, so that all electric fields generated on the voltage compensation layer 30 may act on the gate electrode layer 21, which improves a utilization rate of the electric field formed by the compensation voltage applied to the voltage compensation layer 30 and improves efficiency.

It should be noted that in the above embodiments of the present disclosure, for example, an entire edge of the orthographic projection of the gate electrode layer 21 in the transistor 20 on the base substrate 10 completely exceeds the edge of the orthographic projection of the voltage compensation layer 30 on the base substrate 10 by at least 1 micrometer; alternatively, for example, a part of the edge of the orthographic projection of the gate layer 21 in the transistor 20 on the base substrate 10 exceeds the edge of the orthographic projection of the voltage compensation layer 30 on the base substrate 10 by at least 1 micrometer.

In some embodiments, a thickness of the voltage compensation layer 30 is, for example, between 60 and 150 nanometers. The voltage compensation layer 30 maintains a moderate thickness, thereby preventing the electric field of the voltage compensation layer 30 from interfering with an adjustment effect of the gate electrode layer 21 on channel charges, so as to maintain the transistor 20 with good characteristics.

Figure 4:
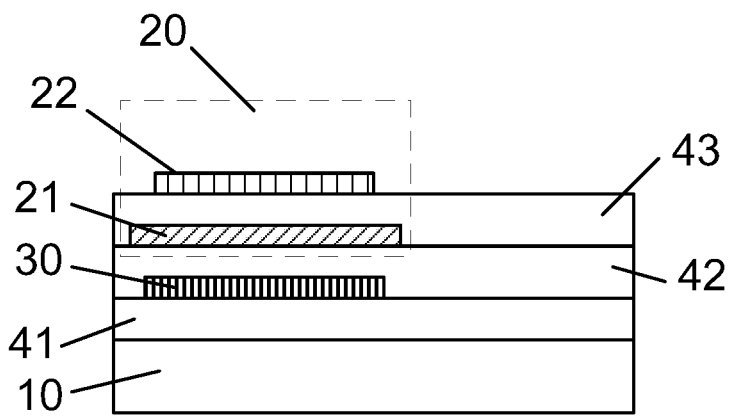
FIG. 4 schematically illustrates another exemplary cross-sectional view of a display panel according to some other embodiments of the present disclosure.
Figure 5:
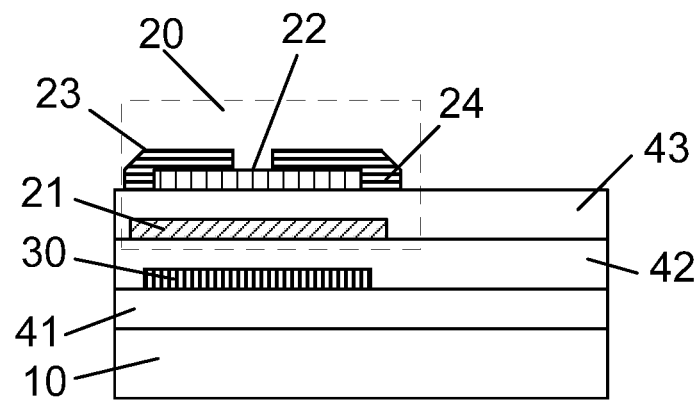
FIG. 5 schematically illustrates yet exemplary cross-sectional view of a display panel according to some other embodiments of the present disclosure.

In some embodiments, as shown in FIG. 3, the active layer 22 is, for example, located between the gate electrode layer 21 and the voltage compensation layer 30. In other embodiments, as shown in FIG. 4, a transistor structure is inverted compared to a transistor structure shown in FIG. 3, in which a gate electrode layer 21 is, for example, alternatively located between a voltage compensation layer 30 and an active layer 22. A transistor 20 is shown completely in FIG. 5, wherein the transistor 20 includes a gate electrode layer 21, an active layer 22, a source electrode 23, a drain electrode 24, and a gate insulating layer 43 located between the gate electrode layer 21 and the active layer 22.

Figure 7A:
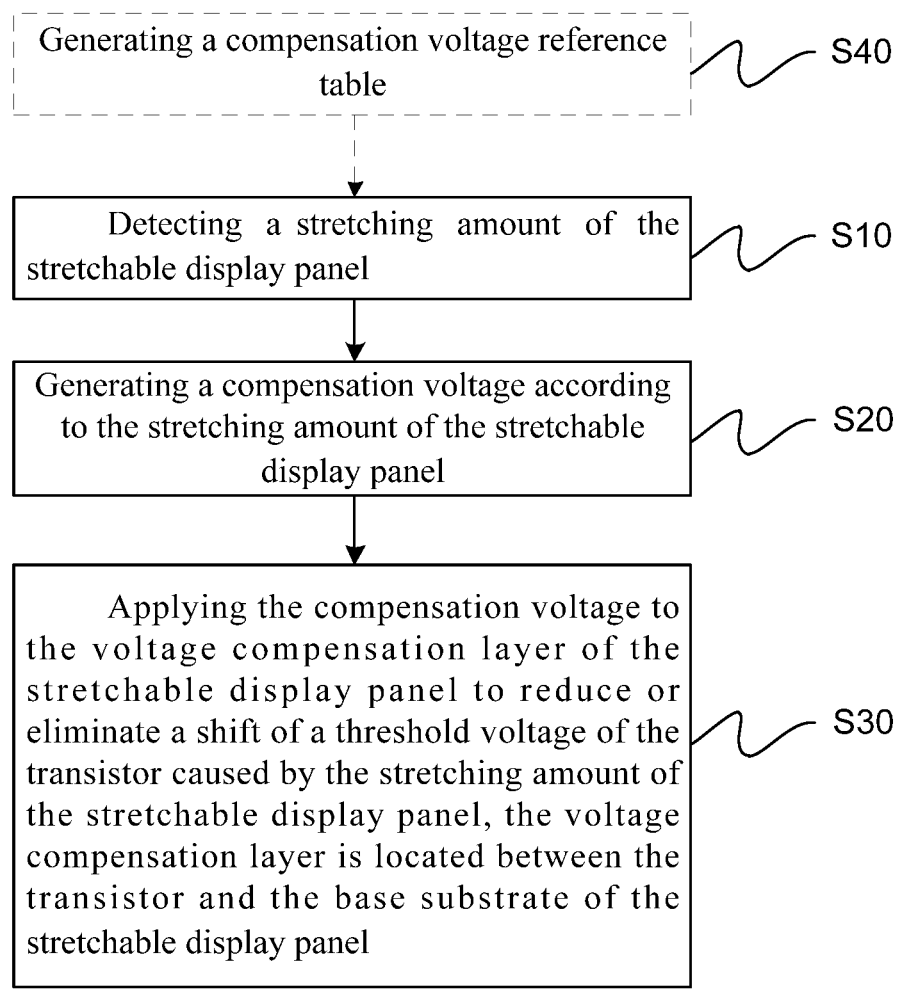
FIGS. 7A, 7B, and 7C schematically illustrate a flowchart of a method for compensating a threshold voltage of a transistor in a stretchable display panel according to some embodiments of the present disclosure.

In another aspect of the embodiments of the present disclosure, a method for compensating a threshold voltage of a transistor in a stretchable display panel is also provided. The transistor is located on a base substrate of the stretchable display panel, and a voltage compensation layer is disposed between the base substrate and the transistor. As shown in FIG. 7A (a dashed box in FIG. 7A indicates an optional step), for example, the method includes:

Step S10: detecting a stretching amount of the stretchable display panel;

Step S20: generating a compensation voltage according to the stretching amount of the stretchable display panel; and Step S30: applying the compensation voltage to the voltage compensation layer of the stretchable display panel to reduce or eliminate a shift of a threshold voltage of the transistor caused by the stretching amount of the stretchable display panel.

In some embodiments, the method may further include:

Step S40: generating a compensation voltage reference table.

In some embodiments, the step S20 further includes:

Step S21: generating a compensation voltage based on the stretching amount of the stretchable display panel and the compensation voltage reference table.

In more specific embodiments, step S21 further includes: based on the stretching amount of the stretchable display panel, generating the compensation voltage by looking up a required compensation voltage value in the compensation voltage reference table.

See Table 3 for an example of the compensation voltage reference table.

Figure 8:
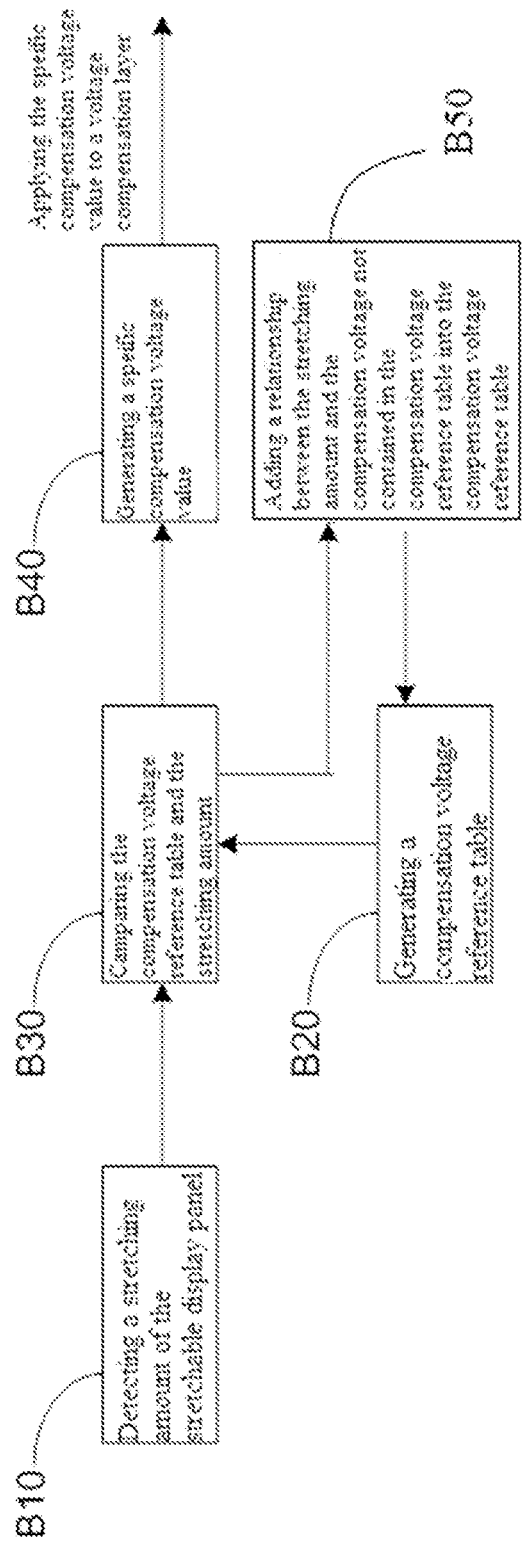
FIG. 8 schematically illustrates a block diagram of using a compensation voltage reference table to compensate a threshold voltage of a transistor in a stretchable display panel.

FIG. 8 illustrates a schematic block diagram of a method for compensating a threshold voltage of a transistor in a stretchable display panel according to some embodiments of the present disclosure. In block B10, a stretching amount of the stretchable display panel is detected, for example, the stretching amount of the display panel is directly detected by a detector 70 (for example, a strain sensor), alternatively, the stretching amount of the display panel may be determined indirectly by, for example, capturing a change of a signal parameter (such as a threshold voltage, etc.) associated with the stretching amount of the display panel. In block B20, a compensation voltage reference table is generated in advance, for example, through actual testing. In block B30, for example, a measured stretching amount of the display panel is compared with the compensation voltage reference table. In block B40, for example, a specific compensation voltage value is generated according to the comparison result, and the compensation voltage value is applied to the voltage compensation layer 30 corresponding to a target transistor. Specifically, based on the stretching amount of the stretchable display panel, looking up a required compensation voltage value in the compensation voltage reference table under or close to the stretching amount of the stretchable display panel, and apply the compensation voltage according to the required compensation voltage value. In some embodiments, the above processes are, for example, performed in real time. As the stretching amount of the display panel changes, the compensation voltage value output from the block B40 also changes continuously. In addition, in some embodiments, for example, the compensation method for the threshold voltage may optionally further include a feedback step from block B30 to block B20, that is, the generating a compensation voltage reference table further includes block B50. That is, a relationship between the stretching amount and the compensation voltage not included in the compensation voltage reference table is added to the compensation voltage reference table.

Figure 7B:
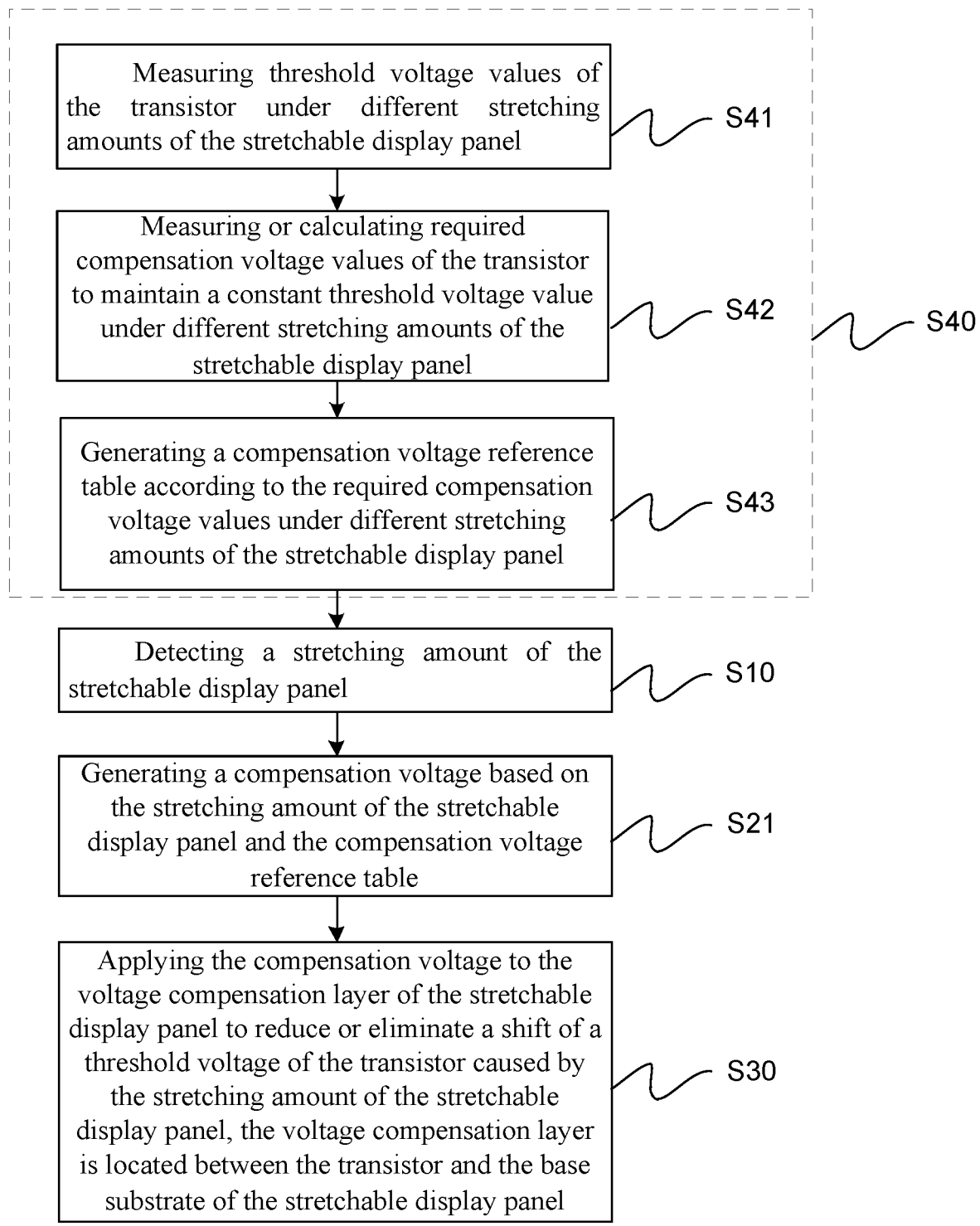

In some embodiments, as shown in FIG. 7B, specific steps of implementing the step S40 in an electrical manner, that is, generating the compensation voltage reference table, are shown, which for example includes:

Step S41: measuring threshold voltage values of the transistor under different stretching amounts of the stretchable display panel;

Step S42: measuring or calculating required compensation voltage values of the transistor to maintain a constant threshold voltage value under different stretching amounts of the stretchable display panel; and Step S43: generating the compensation voltage reference table according to the required compensation voltage values under different stretching amounts of the stretchable display panel.

The measurement or calculation of the compensation voltage values is, for example, refer to Table 2.

Figure 7C:
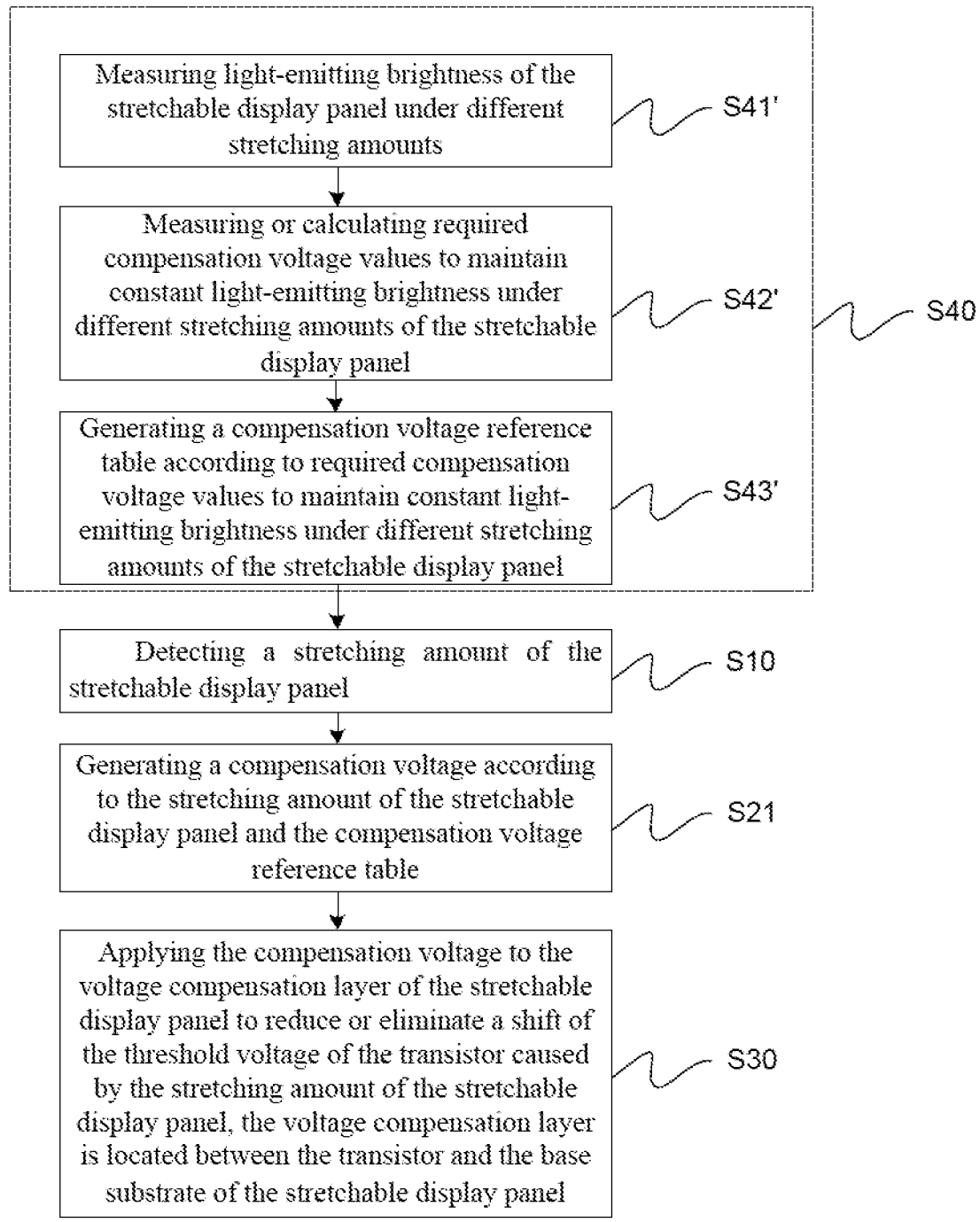

Since light-emitting brightness of the display panel is positively correlated with the threshold voltage of the driving transistor. Therefore, in some embodiments, when the transistor 20 is a driving transistor (for example, a thin film transistor) configured to drive a light-emitting element in the stretchable display panel to emit light, the compensation voltage reference table is, for example, generated by a change of the light-emitting brightness. For example, as shown in FIG. 7C, specific steps of implementing the above step S40 in an optical manner, that is, generating the compensation voltage reference table, are shown, which for example includes:

Step S41': measuring light-emitting brightness of the stretchable display panel under different stretching amounts;

Step S42': measuring or calculating required compensation voltage values to maintain constant light-emitting brightness of the stretchable display panel under different stretching amounts; and Step S43': generating the compensation voltage reference table according to the required compensation voltage values to maintain the constant light-emitting brightness of the stretchable display panel under different stretching amounts.

Table 4 below gives an example of transistor threshold voltages and light-emitting brightness of the display panel corresponding to different stretching amounts of the display panel. Since the measurement of the light-emitting brightness of the display panel is usually more intuitive than the threshold voltage of the transistor, in some application scenarios, generating the compensation voltage reference table based on the light-emitting brightness of the display panel also has certain advantages.

TABLE 4

Light-emitting brightness and required compensation voltages corresponding to different stretching amounts of the display panel

| stretching amount | Vth | light-emitting brightness | compensation voltage | Vth after adjustment |
| --- | --- | --- | --- | --- |
| 0% | −2.9 V | 430 nit | 0 V | −2.9 V |
| 2% | −3 V | 400 nit | −0.5 V | −2.9 V |
| 4% | −3.4 V | 370 nit | −2 V | −2.9 V |
| 6% | −3.5 V | 340 nit | −2.5 V | −2.9 V |

Figure 9:
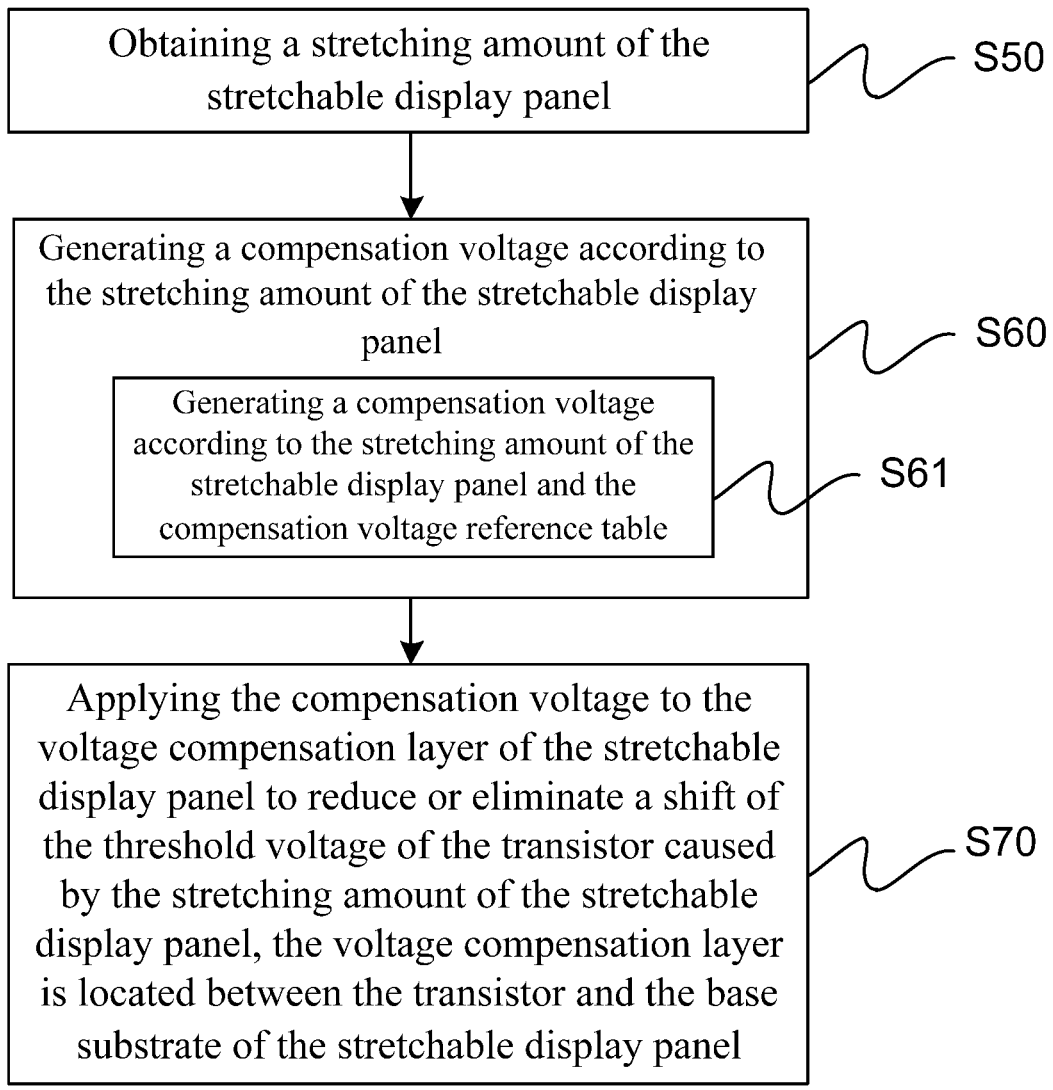
FIG. 9 schematically illustrates steps performed by a computer readable storage medium according to some embodiments of the present disclosure.

In yet another aspect of the embodiments of the present disclosure, a computer readable storage medium is also provided, the computer readable storage medium stores computer instructions for performing a method for compensating a threshold voltage of a transistor in a stretchable display panel, the transistor is located on a base substrate of the stretchable display panel, and a voltage compensation layer is provided between the base substrate and the transistor. Referring to FIG. 9, following steps are implemented when the instructions are executed by a processor:

Step S50: obtaining a stretching amount of the stretchable display panel;

Step S60: generating a compensation voltage according to the stretching amount of the stretchable display panel; and Step S70: applying the compensation voltage to the voltage compensation layer of the stretchable display panel to reduce or eliminate a shift of the threshold voltage of the transistor caused by the stretching amount of the stretchable display panel.

In some embodiments, the generating the compensation voltage according to the stretching amount of the stretchable display panel may include:

Step S61: generating the compensation voltage according to the compensation voltage reference table.

Above detailed description has illustrated the embodiments of the present disclosure by schematic diagrams, flowcharts, and/or examples. In a case where such schematic diagrams, flowcharts, and/or examples include one or more functions and/or operations, those skilled in the art should understand that each function and/or operation in such schematic diagrams, flowcharts, or examples may be implemented individually and/or together through various structures, hardware, software, firmware or substantially any combination of them. In the embodiments of the present disclosure, parts of subject in the embodiments of the present invention may be implemented by an application specific integrated circuit (ASIC), a field programmable gate array (FPGA), a digital signal processor (DSP), or other integrated formats. However, those skilled in the art should note that some aspects of the embodiments may be equivalently implemented in an integrated circuit in whole or in part, which may be implemented as one or more computer programs running on one or more computers (for example, implemented as one or more programs running on one or more computer systems), implemented as one or more programs running on one or more processors (for example, implemented as one or more programs running on one or more microprocessors), implemented as firmware, or substantially implemented as any combination of above manners. Moreover, according to the present disclosure, those skilled in the art will have the ability to design circuits and/or write software and/or firmware codes. In addition, those skilled in the art will note that a mechanism of the subject of the present disclosure may be distributed as various forms of program products, and regardless of the specific type of signal bearing medium that is actually configured to perform the distribution, the exemplary embodiments of the subject of the present disclosure are all applicable. Examples of signal bearing mediums include, but are not limited to recordable medium, such as floppy disks, hard drives, optical disks (CD, DVD), digital tape, computer memory, etc.; and transmission mediums, such as digital and/or analog communication mediums (such as fiber optic cables, waveguides, wired communication links, wireless communication links, etc.).

Although the stretchable OLED display panel is described as an example in the embodiments of the present disclosure, however, those skilled in the art should understand that the embodiments of the present disclosure are not limited thereto. For example, the technical concept of the present disclosure may also be applied to other types of display panels.

Unless there are technical obstacles or contradictions, the embodiments of the present disclosure may be freely combined to form additional embodiments, and the additional embodiments all fall within the protection scope of the present invention.

Although the present disclosure has been described with reference to the drawings, the embodiments disclosed in the drawings are intended to exemplify the preferred embodiments of the present invention, and should not be understood as a limitation to the present invention.

Although the present disclosure has been described with reference to a few typical embodiments, it should be understood that the terms used are illustrative and exemplary rather than restrictive. Since the present disclosure may be implemented in various forms without departing from the spirit or essence of the disclosure, it should be understood that the embodiments are not limited to any of the foregoing details, but should be interpreted broadly within the spirit and scope defined by claims. Therefore, all changes and modifications falling within the scope of the claims or their equivalents shall be covered by the following claims.

What is claimed is:

1. A stretchable display panel, comprising:
a base substrate;
a transistor on the base substrate, wherein the transistor comprises a gate electrode layer and an active layer that are at least partially stacked; and a voltage compensation layer, wherein the voltage compensation layer is located between the transistor and the base substrate, wherein the voltage compensation layer is applied with a compensation voltage that depends on a stretching amount of the stretchable display panel, wherein an orthographic projection of the gate electrode layer of the transistor on the base substrate covers an orthographic projection of the voltage compensation layer on the base substrate.

2. The stretchable display panel of claim 1, further comprising a controller, wherein an output terminal of the controller is electrically connected to the voltage compensation layer, and the controller is configured to apply the compensation voltage to the voltage compensation layer according to the stretching amount of the stretchable display panel.

3. The stretchable display panel of claim 2, further comprising a memory, wherein a compensation voltage reference table is stored in the memory, and the controller is configured to generate the compensation voltage by looking up a required compensation voltage value in the compensation voltage reference table based on the stretching amount of the stretchable display panel.

4. The stretchable display panel of claim 1, wherein the voltage compensation layer comprises a light shielding layer, and the light shielding layer at least partially shields the active layer.

5. The stretchable display panel of claim 1, wherein an orthographic projection of the voltage compensation layer on the base substrate covers an orthographic projection of the active layer in the transistor on the base substrate.

6. The stretchable display panel of claim 5, wherein an edge of the orthographic projection of the voltage compensation layer on the base substrate at least partially exceeds an edge of the orthographic projection of the active layer in the transistor on the base substrate by at least 0.8 micrometers.

7. The stretchable display panel of claim 6, wherein the edge of the orthographic projection of the voltage compensation layer on the base substrate at least partially exceeds the edge of the orthographic projection of the active layer in the transistor on the base substrate by at least 3 micrometers.

8. The stretchable display panel of claim 1, wherein an edge of the orthographic projection of the gate electrode layer of the transistor on the base substrate at least partially exceeds an edge of the orthographic projection of the voltage compensation layer on the base substrate by at least 1 micrometer.

9. The stretchable display panel of claim 1, wherein one of the gate electrode layer and the active layer is located between the voltage compensation layer and the other one of the gate electrode layer and the active layer.

10. The stretchable display panel of claim 1, further comprising an organic light-emitting diode, wherein the transistor is a driving thin film transistor that is configured to drive the organic light-emitting diode to emit light.

11. The stretchable display panel of claim 1, wherein a thickness of the voltage compensation layer is between 60 and 150 nanometers.

12. A method for compensating a threshold voltage of a transistor in a stretchable display panel, wherein the transistor is located on a base substrate of the stretchable display panel, a voltage compensation layer is disposed between the base substrate and the transistor, and the method comprises:

detecting a stretching amount of the stretchable display panel;

generating a compensation voltage according to the stretching amount of the stretchable display panel; and applying the compensation voltage to the voltage compensation layer of the stretchable display panel to reduce or eliminate a shift of the threshold voltage of the transistor caused by the stretching amount of the stretchable display panel, wherein an orthographic projection of the gate electrode layer of the transistor on the base substrate covers an orthographic projection of the voltage compensation layer on the base substrate.

13. The method of claim 12, further comprising: generating a compensation voltage reference table, wherein the generating a compensation voltage according to the stretching amount of the stretchable display panel comprises:

generating the compensation voltage by looking up a required compensation voltage value in the compensation voltage reference table based on the stretching amount of the stretchable display panel.

14. The method of claim 13, wherein the generating a compensation voltage reference table comprises:

measuring threshold voltage values of the transistor under different stretching amounts of the stretchable display panel;

measuring or calculating required compensation voltage values of the transistor to maintain a constant threshold voltage value under different stretching amounts of the stretchable display panel; and generating the compensation voltage reference table according to the required compensation voltage values under different stretching amounts of the stretchable display panel.

15. The method of claim 14, wherein the generating the compensation voltage reference table further comprises:

adding a relationship between the stretching amount and the compensation voltage that is not contained in the compensation voltage reference table into the compensation voltage reference table.

16. The method of claim 13, wherein the transistor is a thin film driving transistor for driving a light-emitting element in the stretchable display panel to emit light, and the generating a compensation voltage reference table comprises:

measuring light-emitting brightness of the stretchable display panel under different stretching amounts;

measuring or calculating required compensation voltage values to maintain constant light-emitting brightness of the stretchable display panel under different stretching amounts; and generating the compensation voltage reference table according to the required compensation voltage values to maintain the constant light-emitting brightness of the stretchable display panel under different stretching amounts.

17. A computer-readable storage medium, wherein the computer-readable storage medium stores computer instructions configured to perform a method for compensating a threshold voltage of a transistor in a stretchable display panel, the transistor is located on a base substrate of the stretchable display panel, a voltage compensation layer is disposed between the base substrate and the transistor, and following steps are implemented when the instruction is executed by a processor:

obtaining a stretching amount of the stretchable display panel;

generating a compensation voltage according to the stretching amount of the stretchable display panel; and applying the compensation voltage to the voltage compensation layer of the stretchable display panel to reduce or eliminate a shift of the threshold voltage of the transistor caused by the stretching amount of the stretchable display panel, wherein an orthographic projection of the gate electrode layer of the transistor on the base substrate covers an orthographic projection of the voltage compensation layer on the base substrate.

\* \* \* \* \*